United States Patent [19]

Cavlan

[11] Patent Number: 4,703,206

[45] Date of Patent: Oct. 27, 1987

[54] FIELD-PROGRAMMABLE LOGIC DEVICE WITH PROGRAMMABLE FOLDBACK TO CONTROL NUMBER OF LOGIC LEVELS

[75] Inventor: Napoleone Cavlan, Cupertino, Calif.

[73] Assignee: Signetics Corporation, Sunnyvale, Calif.

[21] Appl. No.: 799,676

[22] Filed: Nov. 19, 1985

[51] Int. Cl.$^4$ .......................................... H03K 19/177
[52] U.S. Cl. ..................................... 307/465; 307/443;
307/202.1; 307/466; 307/471; 364/716
[58] Field of Search ................ 364/716; 307/443, 480,
307/465–469, 202.1, 272 R, 471, 272 A

[56] References Cited

U.S. PATENT DOCUMENTS

| | | | |
|---|---|---|---|
| 4,157,480 | 6/1979 | Edwards | 307/465 |
| 4,348,737 | 9/1982 | Cukier et al. | 364/716 X |
| 4,422,072 | 12/1983 | Cavlan | 307/465 |
| 4,488,230 | 12/1984 | Harrison | 364/716 X |
| 4,501,977 | 2/1985 | Koike | 364/716 X |
| 4,516,040 | 5/1985 | Zapisek et al. | 364/716 X |
| 4,562,427 | 12/1985 | Ecton | 307/465 X |

FOREIGN PATENT DOCUMENTS 0170122 10/1983 Japan ................................... 307/465

OTHER PUBLICATIONS

Radcliffe, "Fusable Diode Array Circuits", IBM T.D.B., vol. 21, No. 1, Jun. 1978, pp. 105–108.

Primary Examiner—Stanley D. Miller
Assistant Examiner—D. R. Hudspeth
Attorney, Agent, or Firm—R. J. Meetin; J. Oisher; T. Briody

[57] ABSTRACT

A field-programmable logic architecture is centered on a single array of programmable gates that perform either logical NAND or logical NOR operations. Foldback loops can be readily programmed through the array to enable the user to achieve different numbers of logic levels.

20 Claims, 13 Drawing Figures

FIELD-PROGRAMMABLE LOGIC DEVICE WITH PROGRAMMABLE FOLDBACK TO CONTROL NUMBER OF LOGIC LEVELS

FIELD OF USE

This invention relates generally to digital integrated circuits and, in particular, to programmable logic devices.

BACKGROUND ART

Programmable logic devices have become popular in the electronics industry because they allow the manufacturer and user flexibility in tailoring a general integrated circuit to meet specific applications at low cost. Programmable logic devices are generally classified as field-programmable and mask-programmable. In contrast to a mask-programmable logic devices which the manufacturer programs late in the fabrication process and then distributes to the customer, a field-programmable logic device (hereafter generally "PLD") is typically distributed in an unprogrammed state. The customer subsequently programs the PLD to perform a desired logic function.

Logical operations in PLD's are performed with arrays of basic logic gates having programmable elements at selected points. The most common type of programmable element is a fusible link or fuse. A PLD is programmed to imbed a particular function in the device by destroying (or "blowing") a specific pattern of the fuses. Blowing a fuse creates an open circuit at a location where an electrical connection is not wanted. Conversely, a closed circuit exists at a crosspoint where the fuse remains intact to provide an electrical connection. Another type of programmable element is the so-called "antifuse". In contrast to a fuse, an antifuse is initially an open circuit and is programmed to create a closed circuit where an electrical connection is desired.

Turning to the drawings, FIG. 1a illustrates the internal construction of a conventional unprogrammed logical NAND gate C suitable for a PLD using fuses as the programmable elements. Digital input data consisting of N input signals $V_{I1}$-$V_{IN}$ is provided from primary lines $L_1$-$L_N$ to N corresponding input sections of gate C. Letting J be a running integer, each gate input section consists of a Schottky diode $D_J$ connected by way of a gate input line $S_J$ to primary line $L_J$. A fuse $F_{CJ}$ couples line $S_J$ (and diode $D_J$) in the input section to a line $S_C$ in the output section of gate C. An inverter $N_C$ connected to line $S_C$ supplies the gate output signal $V_O$.

Programming involves destroying certain of fuses $F_{C1}$-$F_{CN}$ to disconnect the corresponding input sections of gate C from its output sections. Signal $V_O$ then becomes the logical NAND of only those of signals $V_{I1}$-$V_{IN}$ associated with the fuses that are still intact.

FIG. 1b represents gate C in standard logic notation. This notation is inconvenient for PLD's. The simplified notation of FIG. 1c alleviates this problem. In FIG. 1c, line $S_C$ in the output section crosses each line $L_J$ perpendicularly. Each of the resulting intersections represents the unprogrammed location for a potential coupling of line $S_C$ to line $L_J$ through fuse $F_{CJ}$ (and diode $D_J$) as shown in FIG. 1a. Each unprogrammed intersection is marked with a small circle to distinguish intersections for programmable elements from other circuit intersections not intended to represent programmable elements. The NAND symbol (which encompasses only the gate output section here) is placed at a suitable location along line $S_C$ to indicate the function of the circuitry. The same notation would be used in FIG. 1c if the programmable element were an antifuse instead of a fuse.

FIGS. 2a, 2b, and 2c respectively show the internal circuitry of a conventional unprogrammed logical NOR gate E, its representation in standard logic notation, and its representation in the simplified notation described above. As with gate C, signals $V_{I1}$-$V_{IN}$ are provided from input lines $L_1$-$L_N$ to N input sections of gate E. Each input section consists of an NPN transistor $Q_J$ whose base is connected via a gate input line $S_J$ to line $L_J$ as indicated in FIG. 2a. A fuse $F_{EJ}$ connects the $Q_J$ emitter to a line $S_E$ in the gate output section. Gate output signal $V_O$ is provided from an inverter $N_E$ connected to line $S_E$.

Gate E is utilized in the same way as gate C. Selectively blowing fuses $F_{E1}$-$F_{EN}$ causes signal $V_O$ to become the logical NOR of only those of signals $V_{I1}$-$V_{IN}$ whose fuses remain intact. Likewise, the simplified notation of FIG. 2c is more appropriate to PLD's than the standard notation of FIG. 2b. Each circled intersection in FIG. 2c represents the unprogrammed location for a potential coupling of line $S_E$ to line $L_J$ through fuse $F_{EJ}$.

The preceding remarks also apply to logical AND and logical OR gates. Replacing inverter $N_C$ in gate C with a non-inverting buffer (or simply taking the output signal directly from line $S_C$) transforms the gate into a programmable AND gate. The same thing can be done with gate E to convert it into an OR gate.

It is difficult to adjust the number of basic (or Boolean) logic levels in prior art PLD's. Many simply have fixed numbers of logic levels. Typical of the fixed-level PLD's are the 82S100, 82S103, and 82S105 integrated circuits made by Signetics Corporation. The 82S100 and 82S105 have two levels of Boolean logic. The 82S103 is a single-level device.

FIG. 3a shows the architecture for the 82S100. Circuit input data is transmitted through M input pins $I_1$-$I_M$ to complementary-output buffers $W_1$-$W_M$ which supply the true input data and its complement to array input lines $L_1$-$L_{2M}$. An array of P programmable AND gates $A_1$-$A_P$ ANDs the data on lines $L_1$-$L_{2M}$ to provide a first level of logic as Boolean products. The second level of logic is to form sums of the products. This is done with a array of Q programmable OR gates $E_1$-$E_Q$ that OR the data from gates $A_1$-$A_P$. EXCLUSIVE OR gates $X_1$-$X_Q$ selectively invert the ORed data. The resulting data is supplied through buffers $B_1$-$B_Q$, whose activation can be externally controlled, to output pins $O_1$-$O_Q$.

The 82S103 is similar to the 82S100 except that the 82S103 does not have the OR logic level. Also, the AND array is replaced with an array of programmable NAND gates, each arranged as described in FIG. 1a. The NAND gates are directly connected to the EXCLUSIVE OR gates.

FIG. 3b shows the basic building blocks of the 82S105. In this simplified representation, gates $A_1$-$A_P$ AND the data on input lines $L_1$-$L_{2M}$ and on typical feedback lines $L_{E1}$, $L_{E2}$, and $L_N$. The ANDed data is supplied to typical gates $E_1$-$E_4$ and $E_N$ in a programmable OR array. SR flip-flops $FF_1$ and $FF_2$ provide on-chip data storage. Their data inputs accept the ORed data from gates $E_1$-$E_4$ in synchronism with a clock signal $V_{CK}$. The flip-flop states can be set asynchronously to logical "1" through a preset signal $V_P$. The $FF_1$ output data is fed back to the AND array. The $FF_2$ output data is supplied via an externally controllable buffer $B_F$ to a pin $O_F$. The 82S105 also has a (single) programmable NOR loop for feeding data complementary to that supplied from gates $A_1-A_p$ back into them. The NOR loop is formed with an inverter $N_N$ connected between line $L_N$ and gate $E_N$.

U.S. Pat. No. 4,422,072 describes more advanced versions of the foregoing Signetics PLD's. These more advanced versions offer significantly more architectural flexibility. To a certain degree, they can be programmed to achieve different numbers of basic logic levels. Since they are basically directed toward fixed-level usage, this is a relatively tortuous process which entails sacrificing some of their internal logic resources, package pins, and performance.

GENERAL DISCLOSURE OF THE INVENTION

The present invention provides a programmable logic architecture centered on a single programmable logic array that the user can readily configure in foldback loops to achieve different numbers of Boolean logic levels within a single integrated circuit. This provides a great increase in usage efficiency. The array typically serves as a highly flexible central interconnect system for coupling peripheral logic elements of various complexity.

In particular, the programmable logic device of the invention employs an array of primary logic gates that operate on data transmitted on a plurality of primary lines. Each gate has a plurality of input sections, each connected to a different one of the primary lines. Each gate also has an output section for providing an output signal as either the logical NAND or the logical NOR of the gate input data. The gates have elements for selectively programmably connecting each input section of each gate to its output section. One part of the primary lines are array input lines for receiving external input data to the array. Another part of the primary lines are foldback lines which are respectively connected to the output sections of a corresponding part of the gates, referred to as foldback gates, to receive their output signals.

Insofar as the term "programmably connecting" and similar terms are used herein, these terms are intended to mean both the situation where the programmable elements are initially closed circuits that are opened during programming and the situation in which the programmable elements are initially open circuits that are closed during programming. That is, "programmably connecting" covers both fuses and antifuses.

Configuring the present logic device to obtain various numbers of logic levels simply involves programming the programmable elements located in the array of gates itself. No other elements need to be programmed.

Consider the preferred case in which all the gates are NAND gates. According to DeMorgan's theorem, a NAND gate with inverted inputs functions as an OR gate. If a gate in the present array is programmed to connect its output section to a pair of its input sections connected to foldback lines, the resulting foldback loop through that gate and the corresponding pair of foldback gates yields two levels of NAND logic. These are equivalent to a level of AND logic followed by a level of OR logic. More than two logic levels can be attained by programming further foldback loops through the array. An important feature of the invention is that different input-to-output paths through the device can be programmed to have different numbers of basic logic levels. This makes the invention very adaptable.

Figure 1A:
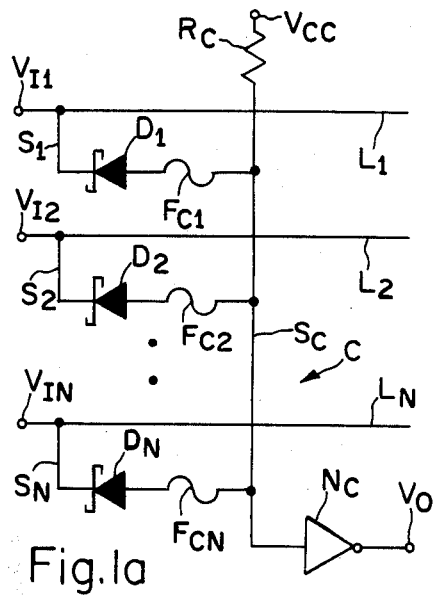
FIGS. 1a, 1b, and 1c respectively show a circuit diagram for a conventional programmable NAND gate, its standard logic representation, and its representation in a simplified PLD notation.

Like reference symbols are employed in the drawings and in the description of the preferred embodiments to represent the same or very similar item or items. Reference symbols beginning with "I" and "O" respectively indicate circuit input and output pins. Reference symbols beginning with "V" indicate signals that are not necessarily transmitted at the input and output pins.

Each circled intersection in which the vertical (crossing) line is connected to ground reference but which is located outside the array(s) of programmable gates indicates a programmable element. By suitably programming this element, the horizontal (crossing) line is either grounded at logical "0" or left as an open circuit at logical "1".

DESCRIPTION OF THE PREFERRED EMBODIMENTS

Figure 4:
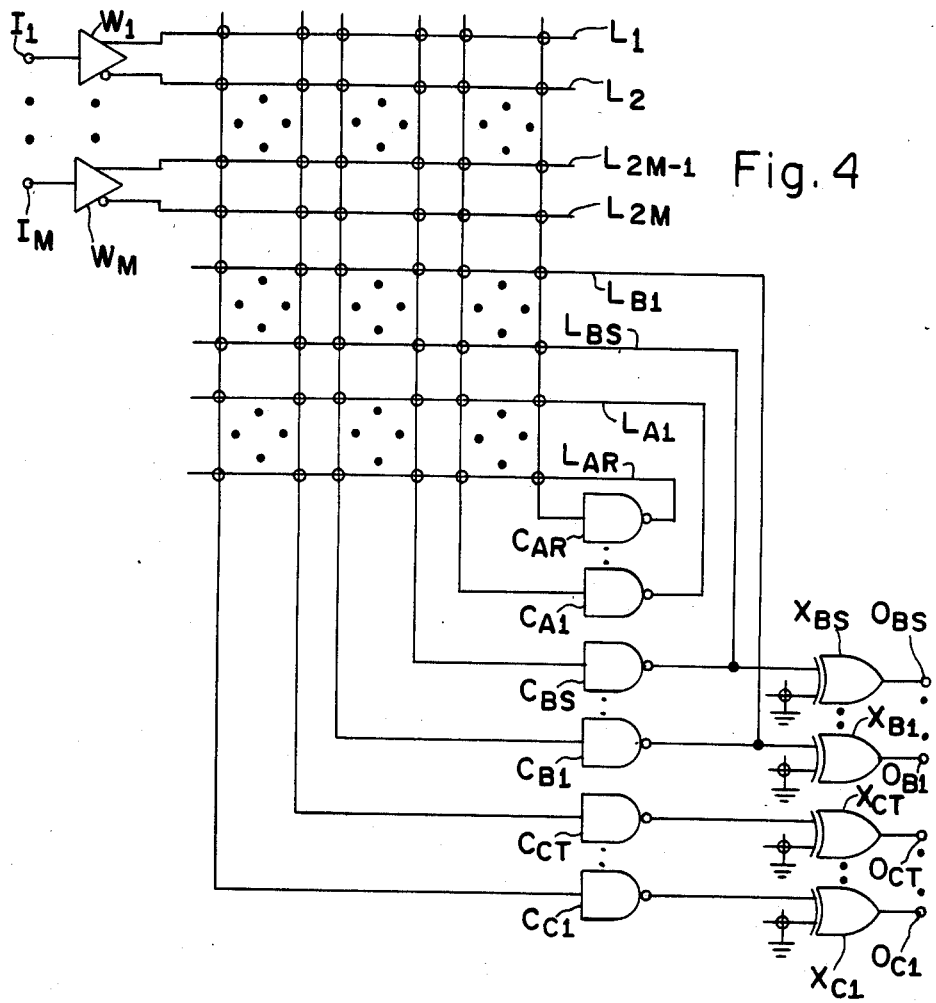
FIGS. 4 and 5 are circuit diagrams for basic PLD's that respectively use NAND and NOR arrays with foldback in accordance with the invention.

FIG. 4 illustrates a single-chip NAND-based field-programmable logic device with foldback that can be programmed to achieve different numbers of levels of logic. This PLD has a group of primary lines consisting of 2M array input lines $L_1-L_{2M}$, R foldback lines $L_{A1}-L_{AR}$, and S foldback lines $L_{B1}-L_{BS}$. Input data to the integrated circuit is transmitted from input pins $I_1-I_M$ to respective complementary-output buffers $W_1-W_M$ which provide the true input data and its complement to input lines $L_1-L_{2M}$.

The PLD has an array of programmable NAND gates whose input sections are respectively connected to lines $L_1-L_{2M}$, $L_{A1}-L_{AR}$, and $L_{B1}-L_{BS}$. Each NAND gate is configured (for example) as shown in FIG. 1a using fuses for programming. One part of the NAND array consists of R foldback gates $C_{A1}-C_{AR}$ whose output sections respectively provide their output signals directly to lines $L_{A1}-L_{AR}$. Another part of the array consists of S foldback gates $C_{B1}-C_{BS}$ whose output sections are similarly connected respectively to lines $L_{B1}-L_{BS}$.

In programming this PLD, the fuses connecting the output sections of each gate $C_{AJ}$ or $C_{BJ}$ (where J is a running integer) to the input section connected to its foldback line $L_{AJ}$ or $L_{BJ}$ must be blown to create open circuits. This is done to avoid oscillations. Alternatively, these particular fuses could simply be deleted in fabricating the array.

The programmable array also includes T gates $C_{C1}-C_{CT}$. The NAND output signals from gates $C_{B1}$–$C_{BS}$ and $C_{C1}$–$C_{CT}$ are respectively provided to the first inputs of S EXCLUSIVE OR gates $X_{B1}$–$X_{BS}$ and T EXCLUSIVE OR gates $X_{C1}$–$X_{CT}$. The second inputs of gates $X_{B1}$–$X_{BS}$ and $X_{C1}$–$X_{CT}$ are programmably groundable to enable output data from gates $C_{B1}$–$C_{BS}$ and $C_{C1}$–$C_{CT}$ to be selectively inverted. The elements that provide the programmable grounding are implemented (for example) in the way described in U.S. Pat. No. 4,422,072, cited above. The output signals from gates $X_{B1}$–$X_{BS}$ and $X_{C1}$–$X_{CT}$ are respectively supplied to S output pins $O_{B1}$–$O_{BS}$ and T output pins $O_{C1}$–$O_{CT}$.

The PLD has a limited number of pins. Consequently, R is normally chosen to be much higher than S so as to maximize pin usage efficiency.

Various numbers of Boolean logic levels can be obtained in the PLD by configuring suitable foldback loops through the NAND array. A foldback loop is created by programming the array in such a manner that there are complete electrical paths extending from two or more of the input sections of each of two or more of the foldback gates—e.g., gates $C_{A1}$ and $C_{A2}$—through their output sections and along their foldback lines—i.e., lines $L_{A1}$ and $L_{A2}$ here—to the output section of another of the gates—e.g., gate $C_{C1}$—by way of its input sections connected to those foldback lines.

Specifically, the $C_{C1}$ fuses "along"—i.e., connected to the gate input sections connected to—lines $L_{A1}$ and $L_{A2}$ are allowed to remain intact. If the user wants gate $C_{A1}$ to respond to input data at pins $I_1$–$I_M$, two or more of the $C_{A1}$ fuses "along" lines $L_1$–$L_{2M}$ are allowed to remain intact, subject to the proviso that the $C_{A1}$ fuse(s) "along" at least one of the two lines extending from the outputs of each of buffers $W_1$–$W_M$ must be blown. The same applies to gate $C_{A2}$ if the user wants it to respond to pin input data.

The result is that gates $C_{A1}$ and $C_{A2}$ receive array input data from certain of lines $L_1$–$L_{2M}$ to provide a first level of NAND logic. The output signals from gates $C_{A1}$ and $C_{A2}$ are supplied as input signals to gate $C_{C1}$ to obtain a second NAND logic level. The foldback loop formed with gates $C_{A1}$, $C_{A2}$, and $C_{A1}$ thereby gives a two-level NAND-NAND arrangement.

A NAND gate is functionally an AND gate with output inversion. Gates $C_{A1}$ and $C_{A2}$ therefore are AND gates with inverters at their outputs. These inverters can be functionally shifted to the $C_{C1}$ inputs. Under DeMorgan's theorem, a NAND gate with inverted inputs performs an OR function. Accordingly, the NAND-NAND arrangement formed with gates $C_{A1}$, $C_{A2}$, and $C_{C2}$ is functionally equivalent to a two-level AND-OR structure. This gives the standard Boolean sum of products.

By slightly altering the preceding foldback loop, it can be placed in series with one or more additional foldback loops to achieve three or more levels of logic. In particular, the array could be programmed so that foldback gates $C_{A1}$ and $C_{A2}$ receive input data from other foldback gates by way of their foldback lines instead of solely from lines $L_1$–$L_{2M}$. A three-level arrangement is a NAND-NAND-NAND structure which is functionally equivalent to an AND-OR-NAND structure (or to a NAND-AND-OR structure). Similarly, a four-level arrangement is a NAND-NAND-NAND-NAND structure functionally equivalent to an AND-OR-AND-OR structure. Of course, a single level of NAND logic is obtained by simply not programming any foldback loop along an input-to-output path through the PLD.

Importantly, different numbers of Boolean logic levels can exist on different input-to-output paths through the PLD. It can thus be readily adapted to a large variety of applications.

Returning momentarily to gates $C_{B1}$–$C_{BS}$, they provide more flexibility. They are generally interchangeable with foldback gates $C_{A1}$–$C_{AR}$ and non-foldback gates $C_{C1}$–$C_{CT}$. Also, gates $C_{B1}$–$C_{BS}$ can be used to supply output data at intermediate logic levels.

Figure 2A:
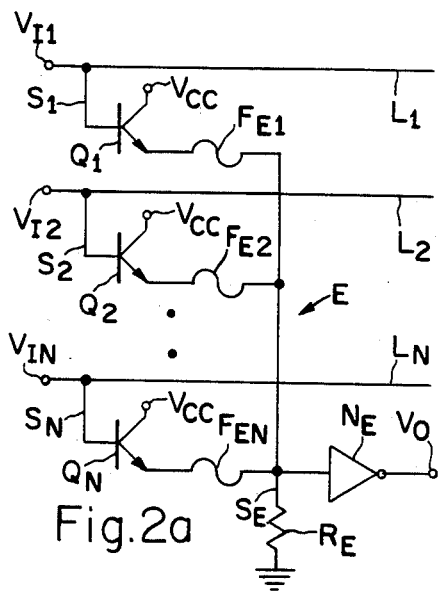
FIGS. 2a, 2b, and 2c respectively show a circuit diagram for a conventional programmable NOR gate, its standard logic representation, and its representation in the simplified PLD notation.
Figure 1B:
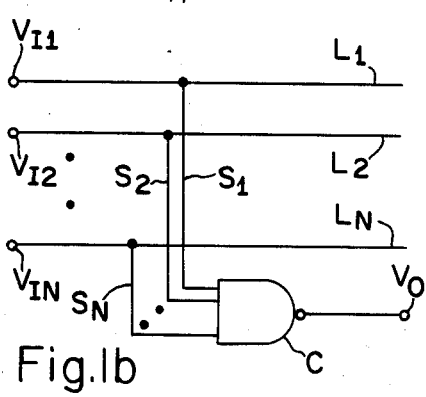
Figure 2B:
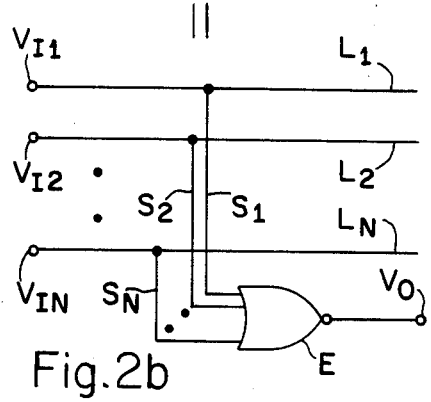
Figure 1C:
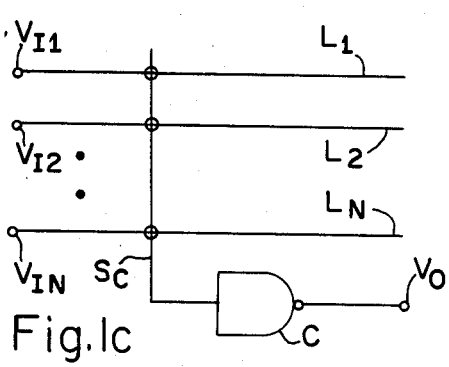
Figure 2C:
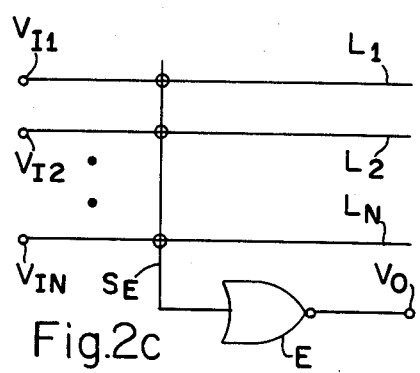
Figure 3A:
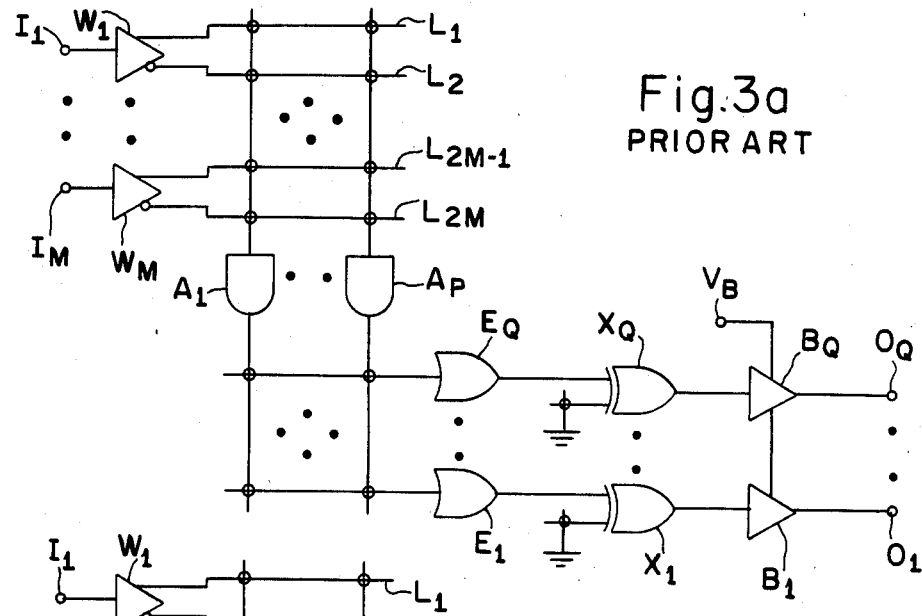
FIGS. 3a and 3b are circuit diagrams respectively representing two prior art PLD's.
Figure 3B:
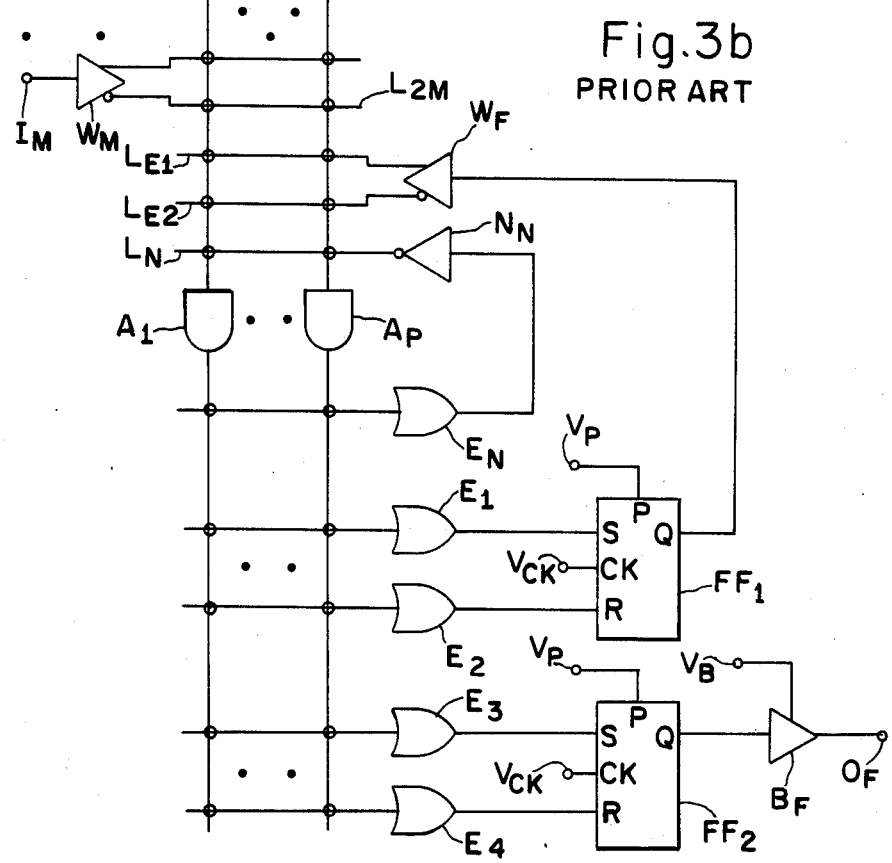
Figure 5:
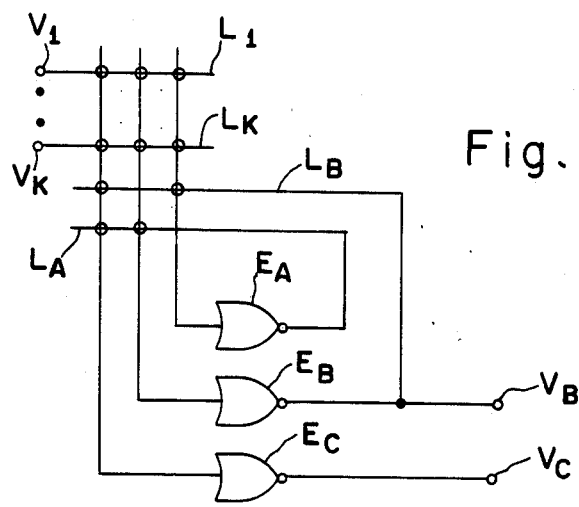

Moving to FIG. 5, it illustrates the building blocks of a NOR-based PLD in which foldback loops can be programmed to achieve different numbers of logic levels. The PLD has K input lines $L_1$–$L_K$ that receive array input data and a group of foldback lines of which two such lines $L_A$ and $L_B$ are shown. The core of this PLD is an array of programmable NOR gates, of which gates $E_A$, $E_B$, and $E_C$ are typical. Each NOR gate is configured (for example) as shown in FIG. 2a. Gates $E_A$ and $E_B$ are foldback gates whose output sections are respectively connected to lines $L_A$ and $L_B$. The gates have input sections respectively connected to lines $L_1$–$L_K$ and to the foldback lines except that gates $E_A$ and $E_B$ are shown here as not having input sections connected respectively to lines $L_A$ and $L_B$ since the associated fuses, if present, would have to be destroyed during programming to prevent oscillations. Gates $E_B$ and $E_C$ provide array output data.

The PLD of FIG. 5 is utilized in the same way as that of FIG. 4. Programming this NOR-based PLD in the manner generally described above for FIG. 4 yields one or more levels of NOR logic. A NOR gate with inverted inputs performs an AND function under DeMorgan's theorem. For the two-level case, the resulting NOR-NOR structure is functionally equivalent to an OR-AND arrangement. This gives a Boolean product of sums.

Figure 6:
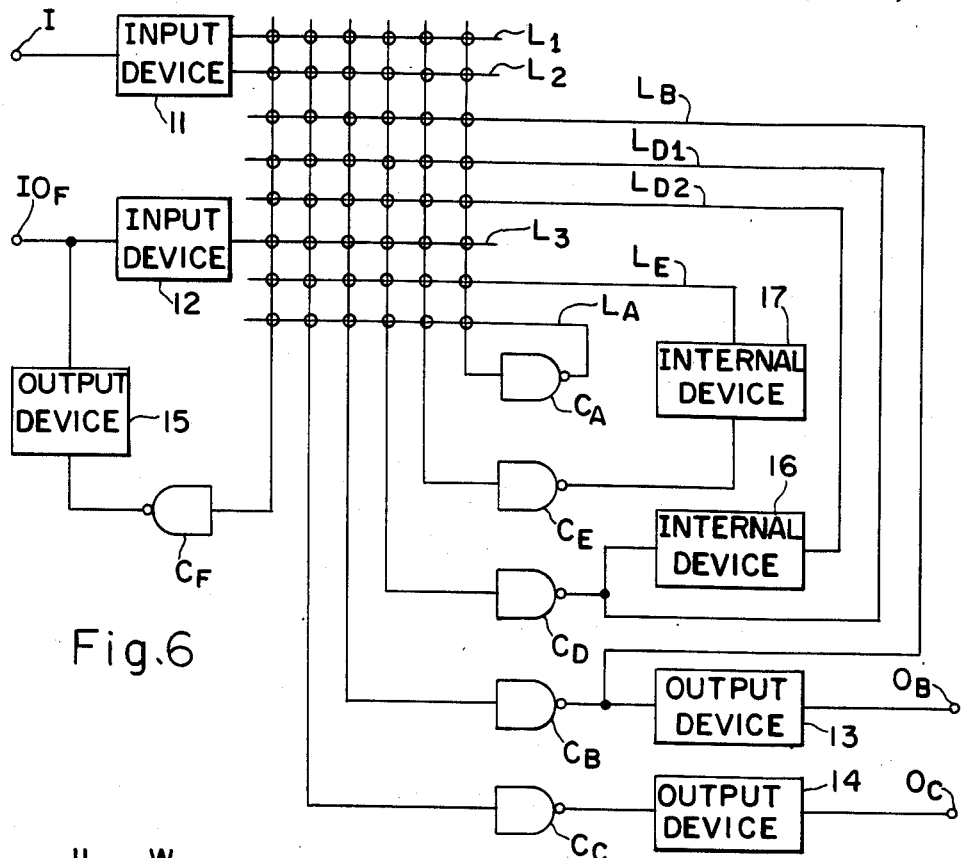
FIG. 6 is a circuit/block diagram for a multi-capability PLD using the NAND core of FIG. 4.

The basic NAND array with foldback in FIG. 4 serves as a central interconnect system for a more complex single-chip PLD whose building blocks are illustrated in FIG. 6. Normally, there are two or more of each of the elements indicated in FIG. 6. Each of the lines leading to and from the various "DEVICE" blocks may also be two or more lines.

With the foregoing in mind, the main programmable array consists of NAND gates $C_A$–$C_F$. On a relative scale, the PLD normally has a large number of foldback gates $C_A$, $C_B$, and $C_D$ so as to maximize usage efficiency.

Input devices 11 and 12 perform logical operations on input data received at pins I and $IO_F$ of the integrated circuit and provide the resulting data to the NAND array on lines $L_1$–$L_3$. Output devices 13, 14, and 15 perform logical operations on the output data from gates $C_B$, $C_C$, and $C_F$ and supply the resulting data to pins $O_B$, $O_C$, and $IO_F$. Internal devices 16 and 17 perform logical operations on the data from gates $C_D$ and $C_E$ and provide the resulting data back to the array. Devices 11–17 can take many forms including inverters, non-inverting buffers, complementary-output buffers, flip-flops, EXCLUSIVE OR gates, counters, registers, multiplexers, decoders, arithmetic logic units, and memories.

The basic advantage of this configuration lies in merging into a single programmable core both "interconnect" and "logic transform" elements required to interlace peripheral on-chip devices (or macros) into a functional whole performing a specific logic algorithm. The core can, in turn, be fragmented and distributed in an unprecedented way to maximize the efficient implementation of each signal path linking individual logic macros on chip.

Figure 7:
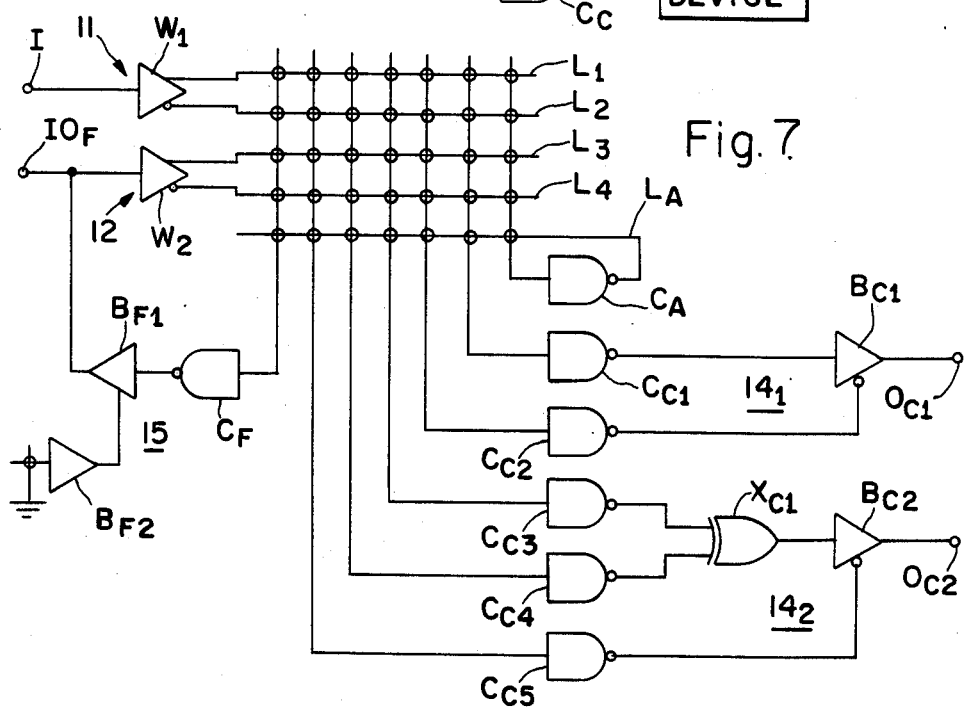
FIGS. 7 and 8 are circuit diagrams for particular embodiments of the PLD of FIG. 6.

FIG. 7 shows a preferred embodiment of the PLD of FIG. 6. The integrated circuit in FIG. 7 is implemented with antifuses. In view of the preceding material, much of FIG. 7 is self-explanatory. Accordingly, only a brief discussion is given here of this preferred embodiment.

Devices 11 and 12 are complementary-output buffers $W_1$ and $W_2$. In device 15, a buffer $B_{F1}$ controls transmission of the $C_F$ output signal to pin $IO_F$. The activation of buffer $B_{F1}$ is controlled by a signal from the output of a buffer $B_{F2}$ whose input is programmably groundable. Permanently enabling buffer $B_{F1}$ makes pin $IO_F$ an output pin and allows the $C_F$ output data to be fed back to buffer $W_2$; the user should not attempt to employ pin $IO_F$ as an input pin. Conversely, disabling buffer $B_{F1}$ fixes pin $IO_F$ as an input pin. Buffer $B_{F1}$ is enabled when the $B_{F2}$ output signal is logical "1", and vice versa.

Output devices $14_1$ and $14_2$ are employed with gate $C_{C1}$–$C_{C5}$ of the NAND array. Device $14_1$ permits or inhibits transmission of the $C_{C1}$ output data to a pin $O_{C1}$ as a function of the $C_{C2}$ output data. This is done with a buffer $B_{C1}$ which lies in the $C_{C1}$ output signal path and whose activation is controlled by the $C_{C2}$ output signal. Device $14_2$ similarly controls transmission of the EXCLUSIVE OR of the $C_{C3}$ and $C_{C4}$ output data to a pin $O_{C2}$. To perform this function, a gate $X_{C1}$ generates the EXCLUSIVE OR of the $C_{C3}$ and $C_{C4}$ output signals. A buffer $B_{C2}$, whose activation is under control of the $C_{C5}$ output signal, controls transmission of the $X_{C1}$ output data to pin $O_{C2}$. Buffers $B_{C1}$ and $B_{C2}$ are enabled when the respective output signals from gates $C_{C2}$ and $C_{C5}$ are logical "0", and vice versa.

The PLD of FIG. 7 preferably has 80 gates $C_A$. This provides an extensive foldback capability. There are 24 devices 11. The PLD has 8 combinations of devices 12 and 15. The PLD also contains 4 devices $14_1$, 4 devices of the same type in which buffer $B_{C1}$ is replaced with an inverter, and 8 devices $14_2$.

Figure 8:
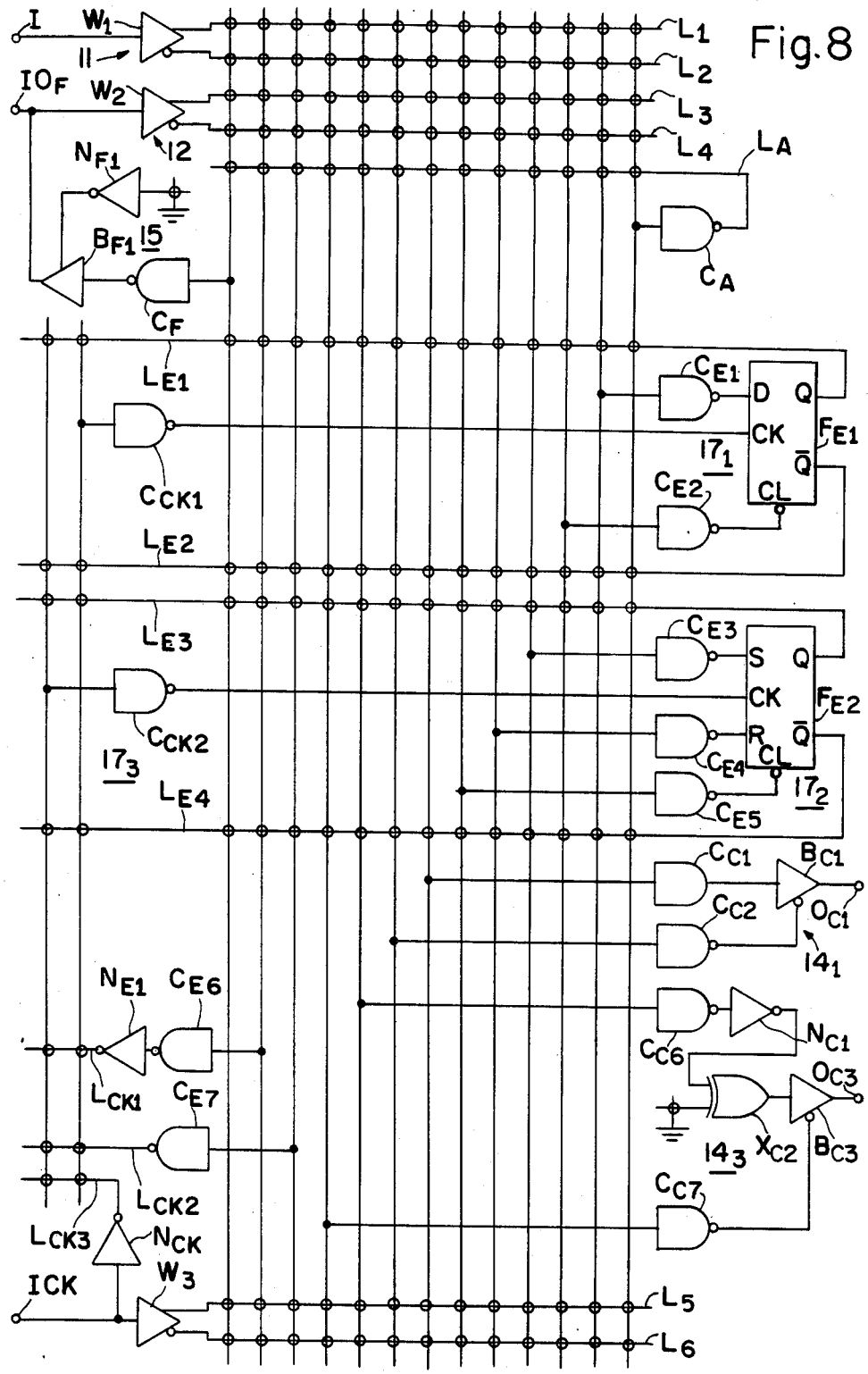

FIG. 8 illustrates another preferred embodiment of FIG. 6. This integrated circuit is implemented with fuses. Only a brief discussion is given here of FIG. 8 since much of it is self-explanatory.

NAND gates $C_{C6}$ and $C_{C7}$ are employed with an output device $14_3$. It controls transmission of either the $C_{C6}$ true output data or its inverse as a function of the $C_{C7}$ output signal. This is accomplished with a gate $X_{C2}$ that generates the EXCLUSIVE OR of the inverse of the $C_{C6}$ output signal and another signal which is programmably either logical "0" or "1". A buffer $B_{C3}$, whose activation is controlled by the $C_{C7}$ output signal, controls transmission of the $X_{C2}$ output signal to pin $O_{C3}$. Buffer $B_{C3}$ is enabled when $C_{CT}$ output signal is logical "0", and vice versa.

NAND gates $C_{E1}$–$C_{E7}$ are used with internal devices $17_1$–$17_3$ to provide on-chip data storage. Device $17_1$ consists of a D-type flip-flop $F_{E1}$ which supplies its true and complementary output signals on lines $L_{E1}$ and $L_{E2}$ in response to a data input signal from gate $C_{E1}$ in synchronism with a clock signal. Device $17_2$ consists of an SR flip-flop $F_{E2}$ which supplies its true and complementary output signals on lines $L_{E3}$ and $L_{E4}$ in response to data input signals from gates $C_{E3}$ and $C_{E4}$ in synchronism with a clock signal. Flip-flops $F_{E1}$ and $F_{E2}$ can be cleared asynchronously to logical "0" in response to the respective output signals from gates $C_{E2}$ and $C_{E5}$. Clearing occurs when the $C_{E2}$ and $C_{E5}$ output signals are logical "0", and vice versa.

Device $17_3$ controls the clocking of flip-flops $F_{E1}$ and $F_{E2}$ with an array of further programmable NAND gates $C_{CK1}$ and $C_{CK2}$ whose output signals are the respective flip-flop clock signals. The input sections of each gate $C_{CK1}$ or $C_{CK2}$ are respectively connected to clock lines $L_{CK1}$–$L_{CK3}$ and to lines $L_{E1}$–$L_{E4}$. Lines $L_{CK1}$–$L_{CK3}$ respectively transmit the inverse of $C_{E6}$ output signal, the $C_{E7}$ output signal, and the inverse of a clocking signal supplied at a pin ICK.

The PLD of FIG. 8 preferably contains 68 foldback gates $C_A$. It has 20 devices 11 and 8 combinations 12/15. There are 4 devices $14_1$, 4 like devices with output inversion, and 8 devices $14_3$. The PLD also has 8 devices $17_1$ and 8 devices $17_2$. There is only one gate $C_{E2}$ or $C_{E5}$ for controlling all 8 flip-flops $F_{E1}$ or $F_{E2}$. Device $17_3$ contains 8 gates $C_{CK1}$, 8 gates $C_{CK2}$, 4 $N_{CK}/W_3$ combinations, 2 gates $C_{E6}$, and 2 gates $C_{E7}$.

While the invention has been described with reference to particular embodiments, this description is solely for the purpose of illustration and is not to be construed as limiting the scope of the invention claimed below. For example, the positions of the diode and the fuse in each of the input sections of the NAND gate of FIG. 1a could be reversed; each input section would then consist only of the gate input line. The same thing applies to FIG. 2a. The NAND and NOR gates could be implemented with elements other than diodes and bipolar transistors. EXCLUSIVE NOR gates can generally be substituted for EXCLUSIVE OR gates. Programming could be done with masks. Thus, various modifications, changes, and applications may be made by those skilled in the art without departing from the true scope and spirit of the invention as defined by the appended claims.

I claim:

1. A programmable logic device having: a plurality of primary lines, at least part of which are input lines for receiving external input data; an array of primary logic gates, each gate having (1) a plurality of input sections of which each is connected to a different one of the primary lines and (2) an output section for providing an output signal as either the logical NAND or the logical NOR of the input data to that gate; and means for selectively programmably connecting each input section of each gate to its output section; characterized in that at least part of the gates are foldback gates whose output sections are respectively connected to corresponding foldback lines consisting of part of the primary lines exclusive of the input lines, whereby each foldback line receives the output signal from the corresponding foldback gate.

2. A device as in claim 1 characterized in that each foldback gate has its input sections respectively connected either to all of the primary lines or to all of the primary lines except its own foldback line.

3. A device as in claim 2 characterized in that the means for connecting comprises a group of programmable elements, each being either a fuse or an antifuse so as to enable the device to be field programmable.

4. A device as in claim 1 wherein the device is part of an integrated circuit having pins for transmitting data to and from the integrated circuit, characterized by output means for performing at least one logical function on the output signal from at least one of the gates to generate device output data and for supplying it to at least one of the pins.

5. A device as in claim 1 characterized by internal means for performing at least one logical function on output data from at least one of the gates to generate internal data and for supplying it to at least one of the primary lines exclusive of the input and foldback lines.

6. A device as in claim 1 characterized in that the primary gates are all NOR gates.

7. A device as in claim 1 characterized in that the primary gates are all NAND gates.

8. A device as in claim 7 wherein the device is part of an integrated circuit having pins for transmitting data to and from the integrated circuit, characterized by means for supplying one of the pins with output data which is either logically the same as or inverse to the output signal from one of the gates, activation of the means for supplying being under control of the output signal from another of the gates.

9. A device as in claim 7 characterized by: a further gate for generating an output signal as either the EXCLUSIVE OR or the EXCLUSIVE NOR of the output signals from a pair of the primary gates; and means for generating an output signal which is either logically the same as or inverse to the output signal from the further gate, activation of the means for generating being under control of the output signal from another of the primary gates.

10. A device as in claim 7 characterized by: a further gate for generating an output signal as either the EXCLUSIVE OR or the EXCLUSIVE NOR of the output signal from one of the primary gates and a signal which is programmably either logical "0" or "1"; and means for generating an output signal which is either logically the same as or inverse to the output signal from the further gate, activation of the means for generating being under control of the output signal from another of the primary gates.

11. A device as in claim 7 characterized by a flip-flop responsive to a clock signal and at least one data input signal for generating an output signal in synchronism with the clock signal, each data input signal being either logically the same as or inverse to the output signal from a corresponding one of the gates.

12. A device as in claim 11 characterized in that one of the primary lines exclusive of the input and foldback lines receives data which is either logically the same as or inverse to the output signal of the flip-flop.

13. A device as in claim 11 characterized in that: the flip-flop is also responsive to a control signal for controlling its output signal irrespective of the clock signal, the control signal being either logically the same as or inverse to the output signal from another of the gates.

14. A device as in claim 11 characterized by a plurality of further lines, one of which receives an input clocking signal; a further logic gate having an output section and a like plurality of input sections respectively connected to the further lines, the output section of the further gate providing the clock signal as the logical NAND of the input data to the further gate; and means for selectively programmably connecting each input section of the further gate to its output section.

15. A device as in claim 14 characterized in that at least one other of the further lines receives data which is either logically the same as or inverse to the output signal from another of the primary gates.

16. A programmable logic device formed as an integrated circuit having pins for receiving device input data and supplying device output data, the device comprising:

input means for performing at least one digital operation on at least a portion of the device input data to generate internal input data;

a plurality of primary lines, part of which are input lines for receiving at least a portion of the internal input data and part of which are foldback lines;

an array of primary logic gates, each gate having (1) a plurality of input sections of which each is connected to a different one of the primary lines and (2) an output section for providing an output signal as either the logical NAND or the logical NOR of the input data to that gate, at least part of the gates being foldback gates respectively corresponding to the foldback lines, the output section of each foldback gate directly connected to the corresponding foldback line so that it receives the output signal from that foldback gate;

means for selectively programmably connecting each input section of each primary gate to its output section; and output means for performing at least one digital operation on the output signal from at least one of the gates to generate at least a portion of the device output data.

17. A device as in claim 16 further including internal means for performing at least one digital operation on the output signal from at least one of the gates to generate internal data and for supplying it to at least one of the primary lines exclusive of the input and foldback lines.

18. A device as in claim 16 wherein each foldback gate has its input sections respectively connected either to all of the primary lines or to all of the primary lines except its own foldback line.

19. A device as in claim 18 wherein the means for connecting comprises a group of programmable elements, each being either a fuse or an antifuse so as to enable the device to be field programmable.

20. A device as in claim 19 wherein the primary gates are all NAND gates.

* * * * *